US012719455B2

(12) United States Patent
Zhang et al.

(10) Patent No.: US 12,719,455 B2
(45) Date of Patent: Aug. 25, 2026

(54) PHOTOSENSITIVE RING OSCILLATOR PREPARATION METHOD AND ARTIFICIAL RETINA THEREOF

(71) Applicant: INSTITUTE OF PHYSICS, CHINESE ACADEMY OF SCIENCES, Beijing (CN)

(72) Inventors: Guangyu Zhang, Beijing (CN); Na Li, Beijing (CN); Congli He, Beijing (CN); Dongxia Shi, Beijing (CN)

(*) Notice: Subject to any disclaimer, the term of this patent is extended or adjusted under 35 U.S.C. 154(b) by 0 days.

(21) Appl. No.: 18/873,350

(22) PCT Filed: Aug. 29, 2022

(86) PCT No.: PCT/CN2022/115588
§ 371 (c)(1),
(2) Date: Dec. 10, 2024

(87) PCT Pub. No.: WO2024/044910
PCT Pub. Date: Mar. 7, 2024

(65) Prior Publication Data

US 2025/0357918 A1 Nov. 20, 2025

(51) Int. Cl.

| | |
|---|---|
| ***H03K 3/03*** | (2006.01) |
| ***H10D 30/67*** | (2025.01) |
| ***H10K 10/46*** | (2023.01) |

(52) U.S. Cl.
CPC ......... *H03K 3/0315* (2013.01); *H10D 30/675* (2025.01); *H10D 30/6755* (2025.01); *H10K 10/472* (2023.02); *H10K 10/481* (2023.02); *H10K 10/484* (2023.02)

(58) Field of Classification Search
CPC ............... H03K 3/0315; H10D 30/675; H10D 30/6755; H10K 10/472; H10K 10/481; H10K 10/484
USPC ...................... 977/700, 701; 331/57; 439/67; 257/617, 67, 40, 9
See application file for complete search history.

(56) References Cited

FOREIGN PATENT DOCUMENTS

WO WO-2024044910 A1 * 3/2024 .......... H03K 3/0315

OTHER PUBLICATIONS

NPL Small article :Small, vol. 17, Issue 26 2008131, Jinheon Jeong, Seung Gi Seo, Seung-Myeong Yu, Yunha Kang, Junyoung Song, Sung Hun Jin First published: May 9, 2021) (Year: 2021).*

* cited by examiner

*Primary Examiner* — Arnold M Kinkead
(74) *Attorney, Agent, or Firm* — Patshegen IP; Moshe Pinchas

(57) ABSTRACT

The present invention relates to a photosensitive ring oscillator, its preparation method, and a flexible artificial retina. Specifically, the photosensitive ring oscillators (PROs) based on 2D semiconducting materials have been fabricated on flexible biological compatible substrates, which transduces light information into electrical pulse signals directly, propagating through the optic nerve. The output oscillating frequency varies quasi-linearly with the change of light intensity. The flexible electronic devices can be used as implantable biomimetic retina for artificial vision to recover the sight sense for sight-handicapped people.

12 Claims, 4 Drawing Sheets

PHOTOSENSITIVE RING OSCILLATOR PREPARATION METHOD AND ARTIFICIAL RETINA THEREOF

TECHNICAL FIELD

The present invention belongs to the technical field of implantable optoelectronic devices. Specifically, the present invention disclosure related to a photosensitive ring oscillator. More specifically, the present invention disclosure relates to a flexible artificial retina based on photosensitive semiconductor materials.

BACKGROUND

Retinal diseases, such as retinitis pigmentosa (RP) and age-related macular degeneration (AMD), cause the retina degenerates progressively, leading to either partial or complete blindness. Tremendous amount of research efforts has been made to develop artificial retina to recover the sight sense for sight-handicapped people. Encouragingly, two implantable prosthetic systems, the epiretinal implant Argus II and the subretinal implant Alpha IMS, have been generated and clinically available, opening the door to explore artificial vision. Artificial retina devices have been employed to sense external light signals and generate electrical signals to stimulate the visual nerve, which help patients producing part of vision, becoming one of the hotspots in the field of biomedicine. However, artificial retina still faces many physiological and technical challenges, limiting the visual experience of the subjects.

The conventional artificial retina devices are rigid and difficult to fit closely with the hemispherical eyeball, which may limit the spatial resolution of imaging. In addition, stiff devices may cause immune responses and mechanical damages to the surrounding tissues and damage the non-regenerative optic nerves. In some prior art by now, the silicon semiconductor used in the artificial flexible retina has a complex structure and does not have good flexibility. In other prior art, near-infrared supervision flexible artificial retinas cannot convert direct current light into pulsed electrical signals.

Therefore, there is a demand for a flexible artificial retina with soft form of the implantable optoelectronic devices. Currently, limited by the preparation of large-area photosensitive semiconductor materials, there is no report of large-area photosensitive ring oscillators.

The present invention proposes a photosensitive ring oscillator for the first time, and the channel material of the oscillator is photosensitive. None of the previous oscillator materials were photosensitive.

SUMMARY OF THE INVENTION

The purpose of the present invention is to provide a photosensitive ring oscillator, preparation methods, and a flexible artificial retina. Aiming at the problems existing in the prior art and based on the working characteristics of the existing retinal prosthesis, the present invention provides a flexible artificial retina suitable for human eyes. The technical scheme provides a flexible artificial retina and a preparation method thereof. The flexible artificial retina senses the external light signal, converting the light signal into bioelectric signal, which stimulates and activates the optic nerve cells and their related networks. And then the optic nerve pathway transmits the nerve information to the visual cortex to establish the visual image.

Before describing the content of the invention, the terms used herein are defined as follows.

The term "PET" refers to polyethylene terephthalate.

The term "PI" refers to polyimide.

The term "PDMS" refers to polydimethylsiloxane.

The term "ITO" refers to Indium Tin Oxide.

The term "TiN" refers to Titanium Nitride.

The term "BN" refers to Boron Nitride.

The term "Bi" refers to Bismuth.

The term "P3HT" refers to poly(3-hexylthiophene).

The term "PPy" refers to Polypyrrole.

The term "CVD" refers to Chemical Vapor Deposition.

The term "ALD" refers to Atomic Layer Deposition.

The term "PROs" refers to photosensitive ring oscillators.

The term "PMMA" refers to polymethyl methacrylate.

The term "PC" refers to polycarbonate.

The first aspect of the present invention provides a photosensitive ring oscillator, the photosensitive ring oscillator comprises a phototransistor, fabricated by odd-numbered inverters connected in series with one additional inverter as the output buffer; wherein the phototransistor comprises the following elements set in sequence form top to bottom:

a flexible substrate;

a gate electrode;

a dielectric layer;

a channel layer; and a contact electrode.

According to the photosensitive ring oscillator of the first aspect, wherein, the flexible substrate is one or more selected from the group consisting of PET, PI, PDMS, PMMA, PC; preferably is one or more selected from the group consisting of PET, PI, PDMS;

the gate electrode is one or more selected from the group consisting of Ti, Au, Ti/Au, Ti/Au/Ti, Ti/Pt, ITO, graphene, TiN; preferably is one or more selected from the group consisting of Ti/Au, Ti/Pt, ITO, graphene, TiN;

the dielectric layer is one or more selected from the group consisting of $Al_2O_3$, $HfO_2$, BN, $SiO_2$, $Hf_{0.5}Zr_{0.5}O_2$; preferably is one or more selected from the group consisting of $Al_2O_3$, $HfO_2$, BN;

the channel layer is one or more selected from the group consisting of two-dimensional semiconductor, photosensitive organic semiconductor, metal compound semiconductor; and/or the contact electrode is one or more selected from the group consisting of Ti, Au, Ti/Au, Ti/Pt, ITO, graphene, Bi, In, Al, TiN, Ir; preferably is one or more selected from the group consisting of Ti/Au, Ti/Pt, ITO, graphene, Bi, In, Al, TiN.

According to the photosensitive ring oscillator of the first aspect, wherein, the two-dimensional semiconductor is one or more selected from the group consisting of $MoS_2$, $MoSe_2$, $WS_2$, $WSe_2$;

the photosensitive organic semiconductor is one or more selected from the group consisting of P3HT, Polypyrrole, Polyaniline;

the metal compound semiconductor is one or more selected from the group consisting of ZnO, CoO, CuS.

According to the photosensitive ring oscillator of the first aspect, wherein, the stage of photosensitive ring oscillator is 2n+1; wherein, n is a integer≥0, preferably form 1 to 200, more preferably form 1 to 100;

the number of the odd-numbered inverters is 3~401, preferably is 3~201; and/or the contact electrode including one or more source electrode and one or more drain electrode.

The second aspect of the present invention provides a method of preparing the photosensitive ring oscillators according to first aspect, the method comprising the following steps:

(1) fabricating the flexible substrate with monolayer two-dimensional semiconductor film;
(2) fabricating the gate electrodes on the flexible substrate prepared by step (1);
(3) depositing the dielectric layer on the gate electrodes;
(4) transferring and patterning the channel materials on the dielectric layer; and
(5) fabricating the contact electrode.

According to the method of the second aspect, wherein in, the step (1) further includes:

epitaxially growing monolayer two-dimensional semiconductor film on a supporting substrate, then transferred to a flexible substrate to obtain the flexible substrate with monolayer two-dimensional semiconductor film;

preferably, the supporting substrate is sapphire or $SiO_2$; more preferably is sapphire.

According to the method of the second aspect, wherein in, the step (2) further includes: the gate electrodes were patterned on flexible substrates, spin-coated photoresist and baked;

preferably, the patterned method is one or more selected from the group consisting of UV-lithography, electron beam evaporation, laser direct writing technology; more preferably is UV-lithography or electron beam evaporation; and/or preferably, the photoresist is PMMA or UV photoresist.

According to the method of the second aspect, wherein in, in step (2):

the speed of spin-coated photoresist is 2000~6000 rpm, preferably is 3500~4500 rpm, more preferably is 3800~4000 rpm;

the baking temperature is 80~120° C., preferably is 90~110° C., more preferably is 95~100° C.; and/or the baking time is 1~7 min, preferably is 2~5 min, more preferably is 3~4 min.

According to the method of the second aspect, wherein in, in step (3):

the depositing method is ALD; and/or the thickness of dielectric layer is 5 nm~100 nm, preferably is 10 nm~90 nm, more preferably is 15 nm~80 nm.

According to the method of the second aspect, wherein in, the step (4) further includes: etching the monolayer two-dimensional semiconductor films from other substrates in alkaline solution and transferred on the already made flexible substrate;

preferably, the alkaline solution is KOH.

According to the method of the second aspect, wherein in, the step (4) further includes: defined the channels;

preferably, the defined method is UV-lithography and reactive ion etching.

The third aspect of the present invention provides a flexible artificial retina, the flexible artificial retina comprises:

the photosensitive ring oscillators according to the first aspect; and/or the photosensitive ring oscillators prepared according to the method according to the second aspect.

The fourth aspect of the present invention provides a method of preparing the flexible artificial retina according to the third aspect, the method comprising:

the method according to the second aspect, and preparing the photosensitive ring oscillators array.

The fifth aspect of the present invention provides a synaptic transistor, the synaptic transistor comprise:

the photosensitive ring oscillator according to the first aspect; and/or the photosensitive ring oscillator prepared according to the method according to the second aspect.

The sixth aspect of the present invention provides a method for treating a retinal disease, the method comprises, applying to a subject in need thereof:

the flexible artificial retina according to the third aspect; and/or the flexible artificial retina prepared according to the method according to the fourth aspect.

In an aspect, the invention relates to a flexible artificial retina. A flexible artificial retina has been provided. Photosensitive ring oscillators (PROs) based on 2D semiconducting materials have been fabricated on flexible biological compatible substrates, which transduces light information into electrical pulse signals directly, propagating through the optic nerve. The output oscillating frequency varies quasi-linearly with the change of light intensity. The flexible electronic devices can be used as implantable biomimetic retina for artificial vision to recover the sight sense for sight-handicapped people.

In another aspect, the invention relates to a flexible artificial retina. More specifically, a flexible artificial retina based on photosensitive semiconductor materials, e.g. two-dimensional semiconductor ($MoS_2$, $MoSe_2$, $WS_2$, $WSe_2$, etc.), photosensitive organic semiconductor (P3HT, Polypyrrole (PPy), Polyaniline), Metal compound semiconductor (ZnO, CoO, CuS) and a manufacturing method thereof, belonging to the technical field of implantable optoelectronic devices.

In order to achieve the above purpose, the technical scheme of the invention is as follows. Photosensitive ring oscillators (PROs) based on photosensitive semiconducting materials have been fabricated on flexible biological compatible substrates, which transduces nature light information into electrical pulse signals directly, propagating through the optic nerve.

In an example, the PROs based on $MoS_2$ films have been fabricated on polyethylene biological compatible substrates, e.g. terephthalate (PET), polyimide (PI), polydimethylsiloxane (PDMS), etc. The output oscillating frequency varies quasi linearly with the change of continuous light intensity. In addition, the output oscillating frequencies responded to RGB (red, green and blue) light sources at the same light intensity are different. This phenomenon shed light on using of the PROs to develop colorful artificial vision.

In general, self-powered modes are encouraged in the artificial vision system. Radio frequency (RF) energy harvester and solar cells to power the PROs have been realized due to the ultralow power consumption.

Furthermore, the PROs were integrated with a synaptic transistor, mimicking the afferent pathway of visual reflex arc.

Compared with the prior art, the invention has the following advantages:

1. The artificial retina based on photosensitive semiconductor PROs devices with excellent flexibility and stretchability, are more compatible with the human body as an implant device.

2. The artificial retina based on photosensitive semiconductor PROs devices does not require the presence of optical sensors, decreasing the complexity of device processing.
3. The artificial retina based on photosensitive semiconductor PROs devices show ultralow power consumption.

In an aspect, the achieved flexible electronic devices can be used as implantable biomimetic retina for artificial vision to recover the sight sense for sight-handicapped people.

BRIEF DESCRIPTION OF THE DRAWINGS

A more detailed description of the embodiments of this application is given in conjunction with the appended drawings. In the drawings.

DESCRIPTION OF THE ATTACHED MARKERS

Figure 1:
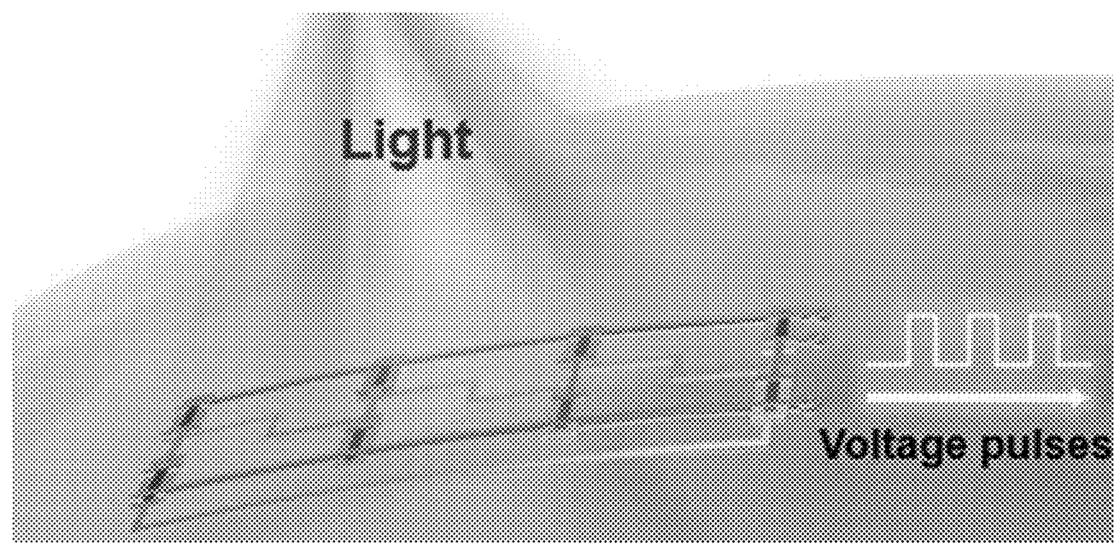
FIG. 1 shows a schematic diagram of the flexible artificial retina.

1, The substrate; 2, The gate electrode; 3, The dielectric layer; 4, The channel layer; 5, The contact electrodes (including the source electrode and the drain electrode).

DETAILED DESCRIPTION OF THE EMBODIMENTS

The invention is further described in the appended drawings and specific embodiments below.

This application provides a flexible artificial retina and a preparation method thereof. The flexible artificial retina senses the external nature light signal, converting the continuous light signal into bioelectric signal, propagating through the optic nerve. Specifically, the flexible artificial retina based on photosensitive semiconductor materials have been fabricated on biological compatible substrates, e.g. PET, PI, PDMS etc.

The following examples further illustrate the present disclosure and are not intended to limit the scope of the invention.

The present invention will be described in more detail below with reference to the accompanying drawings. In each of the drawings, the same elements are represented by similar reference numerals. For clarity, the parts in the drawings are not drawn to scale. In addition, some well-known parts may not be shown in the figure.

Example 1

This embodiment is used to illustrate the preparation of the light-sensitive ring oscillator and a flexible artificial retina.

FIG. 1 shows the schematic diagram of the flexible artificial retina. The flexible artificial retina based on $MoS_2$ have been fabricated on PET and PI biological compatible substrates. PROs serve as vision pixels which can convert continuous light into electrical pulses directly.

Figure 2:
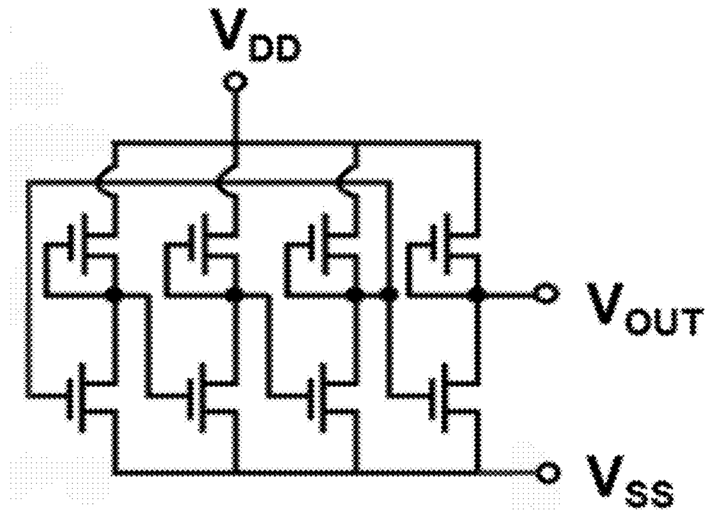
FIG. 2 shows a schematic diagram of the PROs serving as vision pixels, wherein, $V_{DD}$ and $V_{SS}$ are supply voltages, $V_{OUT}$ is output voltage.

FIG. 2 shows the schematic diagram of the PRO, here is a three-stage PRO fabricated by odd-numbered inverters connected in series with one additional inverter as the output buffer. PRO is consisting of phototransistors.

Figure 3:
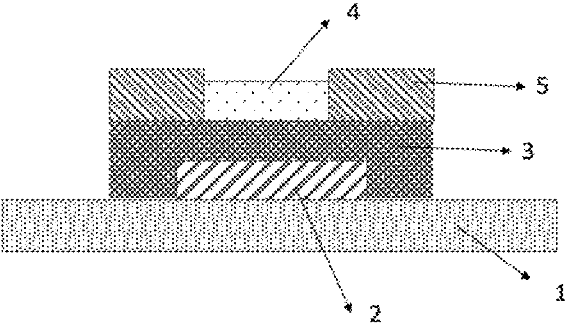
FIG. 3 shows a schematic diagram of the phototransistor, which is the basic unit for PRO.

FIG. 3 shows the schematic diagram of the phototransistor. The substrate 1 could be PET, PI, PDMS biological compatible substrates. The gate electrode 2 could be Ti/Au, Ti/Pt, ITO, graphene, TiN, etc. The dielectric layer 3 could be $Al_2O_3$, $HfO_2$, BN etc. The channel materials 4 could be $MoS_2$, $WS_2$, $WSe_2$, $MoSe_2$, P3HT etc. photosensitive 2D, organic or other semiconductor materials. The source and drain electrodes 5 could be Ti/Au, Ti/Pt, ITO, graphene, Bi, In, Al, TiN, etc.

Figure 4:
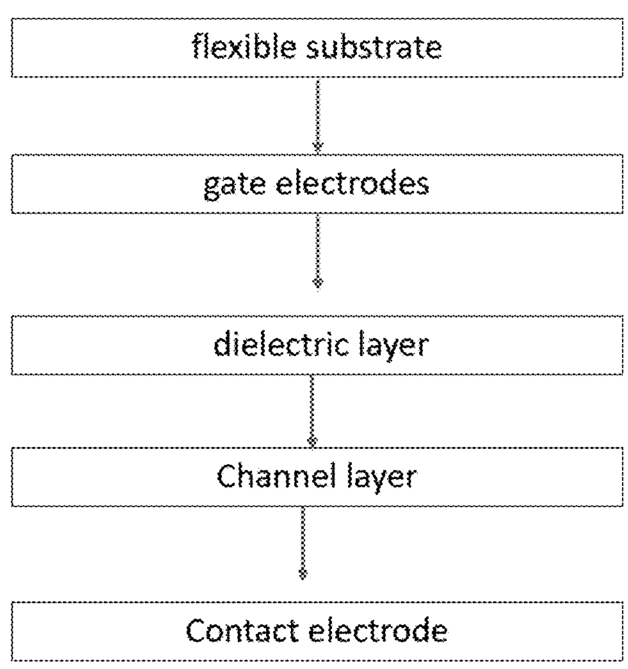
FIG. 4 shows a flow chart of preparation method of flexible artificial retina.

FIG. 4 shows flow chart of preparation method of flexible artificial retina. First, flexible substrate was chosen and fabricated. Second, gate electrodes were fabricated on flexible substrate. Third, dielectric layer was deposited on gate electrodes. Fourth, photosensitive semiconductor materials were transferred on the dielectric and patterned. Fifth, source and drain electrodes were fabricated. Then the flexible artificial retina based on PROs array was fabricated. Materials. Taking PI, $MoS_2$ semiconductor material as an example, the detailed preparation process is as follows:

(1) Monolayer $MoS_2$ films were epitaxially grown on sapphire substrates (4-inch wafers) by CVD approach. 5 μm-thick Polyimide (PI) layer was prepared by spin-coating (at 4000 rpm) on the sapphire substrate, and then separated from the substrate in deionized (DI) water.

(2) Ti/Au/Ti (2/10/2 nm) was patterned on flexible PI or PET substrates by UV-lithography and electron beam evaporation. Photoresist was spin-coated at a speed of 4000 rpm and baked at 100° C. for 4 min.

(3) gate dielectrics of 30 nm $Al_2O_3$ were individually deposited at 110° C. by atomic layer deposition (ALD).

(4) monolayer $MoS_2$ films were etched from sapphire substrates in KOH solution and transferred on the already made substrate under the assistance of polymethyl methacrylate (PMMA) supporting.

(5) $MoS_2$ channels were defined by UV-lithography and reactive ion etching. Ti/Au (2/30 nm) is used for the contact metal.

Figure 5:
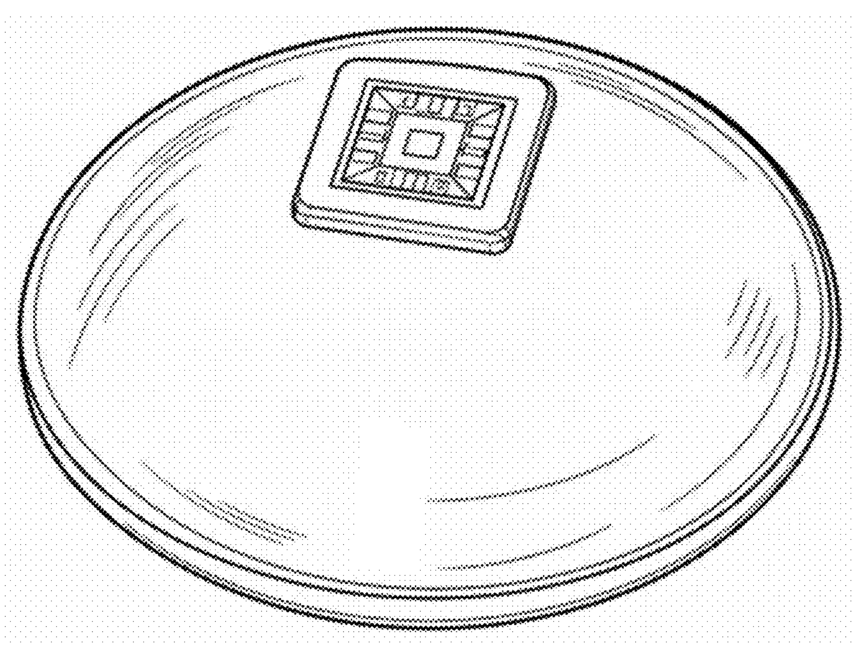
FIG. 5 shows a photograph of the flexible artificial retina based on PROs fabricated on contact lenses.

FIG. 5 shows a photograph of the flexible artificial retina based on PROs fabricated on contact lenses.

Example 2

This embodiment is used to illustrate the preparation of the light-sensitive ring oscillator and a flexible artificial retina.

The steps in this embodiment are the same as those in embodiment 1 except for step 3.

(3) gate dielectrics of 20 nm $HfO_2$ were individually deposited at 110° C. by atomic layer deposition (ALD).

Example 3

This embodiment is an example to illustrate the specific technical effect of the present invention.

This example uses the sample prepared by Example 1.

Figure 6:
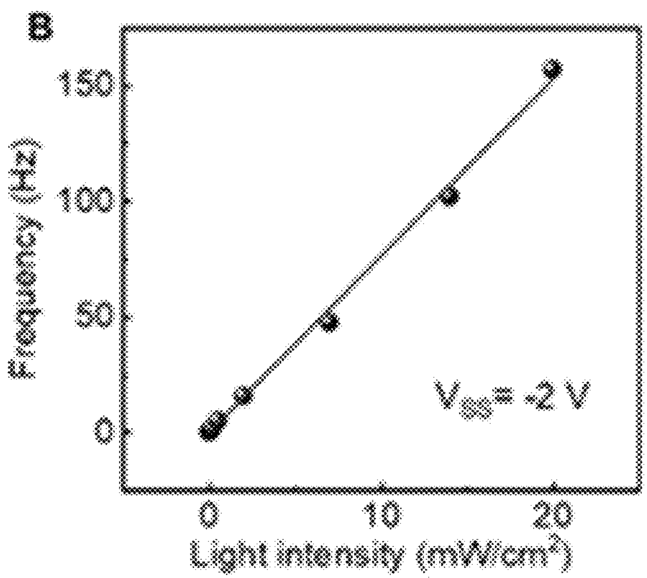
FIG. 6 shows that the output frequency is dependent on the intensity of illuminated light.

FIG. 6 shows the output frequency depending on the intensity of illuminated light, which increases with the intensity of illuminated light. The output oscillating frequency varies quasi linearly with the light intensity from 0 to 20 $mW/cm^2$ kHz (high light intensity of $(20\ mW)/cm^2$)) covering the frequency range of human visual impulse. The quasi-linear variation of output pulse frequency with light intensity is one of the most important goals in the design of artificial retina microchip.

Figure 7:
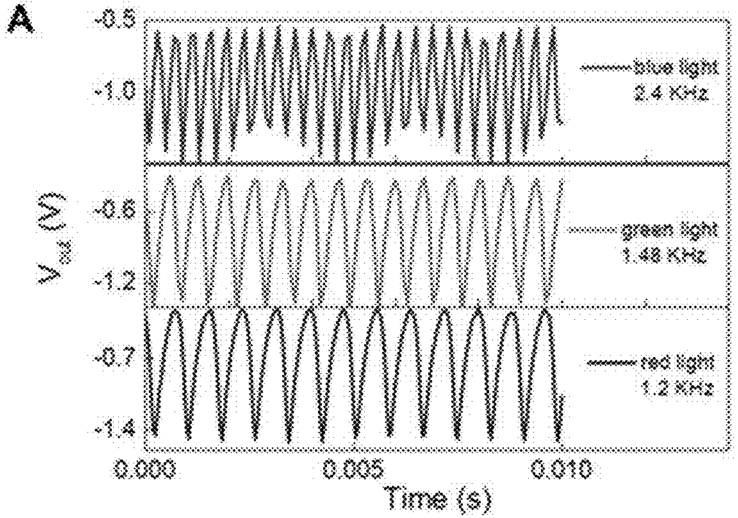
FIG. 7 shows that the output frequencies response to RGB (red, green and blue) light sources at the same light intensity.
Figure 8:
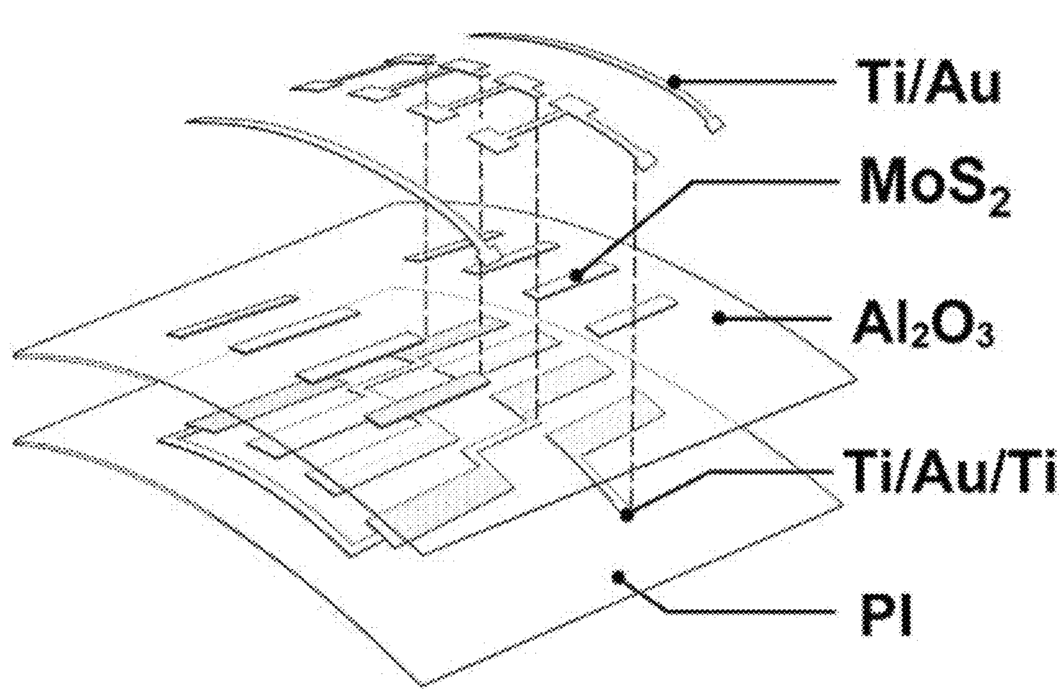
FIG. 8 shows the layered structure of an individual flexible PRO.

FIG. 7 shows the different output frequencies response to RGB (red, green and blue) light sources at the same light intensity, shedding light on using of the ROs devices to develop colorful artificial vision.

The ultralow power photosensitive materials-based flexible electronic devices with simple structure, excellent implantability are promising to explore implantable biomimetic retina for artificial vision.

Example 4

This embodiment shows another example to illustrate the specific technical effect of the present invention.

This example uses the sample prepared by Example 2.

The output frequency of the sample prepared by Example 2, which depends on the intensity of illuminated light and increases with the intensity of illuminated light, similar to Example 1, covering the frequency range of human visual impulse. The quasi-linear variation of output pulse frequency with light intensity is one of the most important goals in the design of artificial retina microchip.

Also the samples prepared by Example 2 similarly response to RGB (red, green and blue) light sources at the same light intensity, shedding light on using of the ROs devices to develop colorful artificial vision.

The ultralow power photosensitive materials-based flexible electronic devices with simple structure, excellent implantability are promising to explore implantable biomimetic retina for artificial vision.

Heretofore, the technical solution of the present invention has been described with reference to the preferred embodiments shown in the drawings, but it is easy for the person skilled in the art to understand that the protection scope of the present invention is obviously not limited to these specific embodiments. On the premise of not deviating from the principle of the present invention, a person skilled in the art can make equivalent changes or substitutions to relevant technical features, and the technical solutions after these changes or substitutions will fall within the protection scope of the present invention.

The invention claimed is:

1. A photosensitive ring oscillator for use in flexible artificial retina, characterized in that, the photosensitive ring oscillator comprises at least one phototransistor, wherein said at least one phototransistor is fabricated by odd-numbered inverters connected in series with one additional inverter as the output buffer; and wherein said at least one phototransistor comprises the following elements set in sequence from top to bottom:

a flexible substrate;

a gate electrode;

a dielectric layer;

a channel layer; and a contact electrode;

and wherein, the material of channel layer is two-dimensional semiconductor and/or photosensitive organic semiconductor.

2. The photosensitive ring oscillator according to claim 1, characterized in that:

the material of flexible substrate is one or more selected from the group consisting of PET, PI, PDMS, PMMA, PC; preferably is one or more selected from the group consisting of PET, PI, PDMS;

the material of gate electrode is one or more selected from the group consisting of Ti, Au, Ti/Au, Ti/Au/Ti, Ti/Pt, ITO, graphene, TiN; preferably is one or more selected from the group consisting of Ti/Au, Ti/Pt, ITO, graphene, TiN;

the material of dielectric layer is one or more selected from the group consisting of Al2O3, $HfO_2$, BN, $SiO_2$, $Hf_{0.5}Zr_{0.5}O_2$; preferably is one or more selected from the group consisting of $Al_2O_3$, $HfO_2$, BN; and/or the material of contact electrode is one or more selected from the group consisting of Ti, Au, Ti/Au, Ti/Pt, ITO, graphene, Bi, In, Al, TiN, Ir; preferably is one or more selected from the group consisting of Ti/Au, Ti/Pt, ITO, graphene, Bi, In, Al, TiN.

3. The photosensitive ring oscillator according to claim 1, characterized in that:

the material of two-dimensional semiconductor is one or more selected from the group consisting of $MoS_2$, $MoSe_2$, $WS_2$, $WSe_2$; and/or the material of photosensitive organic semiconductor is one or more selected from the group consisting of P3HT, Polypyrrole, Polyaniline.

4. The photosensitive ring oscillator according to claim 1, characterized in that: the stage of photosensitive ring oscillator is 2n+1;

wherein, n is a integer >0, preferably form 1 to 200, more preferably form 1 to 100;

the number of the odd-numbered inverters is 3~401, preferably is 3~201; and/or the contact electrode including one or more source electrode and one or more drain electrode.

5. A method of preparing the photosensitive ring oscillator according to claim 1, characterized in that, the method comprising the following steps: (1) fabricating the flexible substrate with monolayer two-dimensional semiconductor film; (2) fabricating the gate electrodes on the flexible substrate prepared by step (1); (3) depositing the dielectric layer on the gate electrodes;

(4) transferring and patterning the channel materials on the dielectric layer; and (5) fabricating the contact electrode.

6. The method according to claim 5, characterized in that, the step (1) further includes:

epitaxially growing monolayer two-dimensional semiconductor film on a supporting substrate, then transferred to a flexible substrate to obtain the flexible substrate with monolayer two- dimensional semiconductor film;

preferably, the supporting substrate is sapphire or $SiO_2$; more preferably is sapphire.

7. The method according to claim 5, characterized in that, the step (2) further includes: the gate electrodes were patterned on flexible substrates, spin-coated photoresist and baked;

preferably, the patterned method is one or more selected from the group consisting of UV-lithography, electron beam evaporation, laser direct writing technology; more preferably is UV-lithography or electron beam evaporation; and/or preferably, the photoresist is PMMA or UV photoresist.

8. The method according to claim 7, characterized in that, in step (2):

the speed of spin-coated photoresist is 2000~6000 rpm, preferably is 3500~4500 rpm, more preferably is 3800~4000 rpm;

the baking temperature is 80~120° C., preferably is 90~110° C., more preferably is 95~100° C.; and/or the baking time is 1~7 min, preferably is 2~5 min, more preferably is 3~4 min.

9. The method according to claim 5, characterized in that, in step (3):

the depositing method is ALD; and/or the thickness of dielectric layer is 5 nm~100 nm, preferably is 10 nm~90 nm, more preferably is 15 nm~80 nm.

10. The method according to claim 5, characterized in that, the step (4) further includes: etching the monolayer two-dimensional semiconductor films from other substrates in alkaline solution and transferred on the already made flexible substrate;

preferably, the alkaline solution is KOH.

11. The method according to claim 5, characterized in that, the step (4) further includes: defined defining a pattern of the channel channels;preferably, and wherein patterning of the channel is carried out with the defined method is UV-lithography and/or reactive ion etching.

12. A flexible artificial retina, characterized in that, the flexible artificial retina comprises: the photosensitive ring oscillator according to claim 1.

* * * * *